(12) United States Patent
Reblewski

(10) Patent No.: US 7,130,788 B2
(45) Date of Patent: Oct. 31, 2006

(54) EMULATION COMPONENTS AND SYSTEM INCLUDING DISTRIBUTED EVENT MONITORING, AND TESTING OF AN IC DESIGN UNDER EMULATION

(75) Inventor: Frederic Reblewski, Paris (FR)

(73) Assignee: Mentor Graphics Corporation, Wilsonville, OR (US)

( * ) Notice: Subject to any disclaimer, the term of this patent is extended or adjusted under 35 U.S.C. 154(b) by 716 days.

(21) Appl. No.: 10/003,184

(22) Filed: Oct. 30, 2001

(65) Prior Publication Data

US 2004/0034841 A1    Feb. 19, 2004

(51) Int. Cl.
G06F 9/455 (2006.01)
(52) U.S. Cl. .................. 703/28; 703/23; 714/725; 716/4; 716/5
(58) Field of Classification Search .............. 703/28, 703/23, 22; 714/725; 716/5, 4; 712/15; 1/1; 370/249; 326/40, 39
See application file for complete search history.

(56) References Cited

U.S. PATENT DOCUMENTS

| | | | |
|---|---|---|---|
| 4,860,290 A | | 8/1989 | Daniels et al. |
| 5,036,473 A | | 7/1991 | Butts et al. |
| 5,109,353 A | | 4/1992 | Sample et al. |
| RE34,363 E | | 8/1993 | Freeman |
| 5,572,710 A | | 11/1996 | Asano et al. |
| 5,596,742 A | | 1/1997 | Agarwal et al. |
| 5,663,900 A | * | 9/1997 | Bhandari et al. ............ 1/1 |
| 5,680,583 A | | 10/1997 | Kuijsten |
| 5,777,489 A | * | 7/1998 | Barbier et al. ............. 326/40 |
| 5,821,773 A | | 10/1998 | Norman et al. |
| 5,870,586 A | | 2/1999 | Baxter |
| 5,940,603 A | * | 8/1999 | Huang ..................... 716/5 |
| 5,943,490 A | | 8/1999 | Sample |
| 5,999,725 A | | 12/1999 | Barbier et al. |
| 6,002,861 A | | 12/1999 | Butts et al. |
| 6,052,524 A | * | 4/2000 | Pauna ..................... 703/22 |
| 6,141,636 A | | 10/2000 | Sarno et al. |
| 6,184,707 B1 | | 2/2001 | Norman et al. |
| 6,265,894 B1 | * | 7/2001 | Reblewski et al. ........... 326/39 |
| 6,282,503 B1 | | 8/2001 | Okazaki et al. |
| 6,377,912 B1 | | 4/2002 | Sample et al. |
| 6,388,465 B1 | | 5/2002 | Barbier et al. |
| 6,473,726 B1 | | 10/2002 | Reblewski |
| 6,496,918 B1 | * | 12/2002 | DeHon et al. ............. 712/15 |

(Continued)

FOREIGN PATENT DOCUMENTS

EP    0651343 A1    5/1995

(Continued)

OTHER PUBLICATIONS

Ni et al., "A 256X256 pixel smart CMOS image sensor for line-based stereo vision applications", IEEE 2000.*

(Continued)

Primary Examiner—Kandasamy Thangavelu
(74) Attorney, Agent, or Firm—Banner & Witcoff, Ltd.

(57) ABSTRACT

Data processing resources are distributively provided to an emulation system to locally and correspondingly generate testing stimuli, and applying the generated testing stimuli to partitions of an IC design to be emulated. In one embodiment, the distributed data processing resources further locally and correspondingly retrieve state data of emulation state circuit elements, analyze the retrieved state data for one or more events, and report the one or more events upon their detection. In one embodiment, the distributed data processing resources are disposed on logic boards of an emulation system. In other embodiments, at least some of the distributed data processing resources are disposed on the emulation ICs of the logic boards.

16 Claims, 10 Drawing Sheets

U.S. PATENT DOCUMENTS

| | | | |
|---|---|---|---|
| 6,625,793 | B1 | 9/2003 | Sample et al. |
| 6,694,464 | B1* | 2/2004 | Quayle et al. ............... 714/725 |
| 2002/0055828 | A1 | 5/2002 | Swoboda et al. |
| 2002/0116168 | A1* | 8/2002 | Kim ............................ 703/28 |
| 2003/0179712 | A1* | 9/2003 | Kobayashi et al. ......... 370/249 |
| 2003/0182641 | A1* | 9/2003 | Yang .............................. 716/4 |
| 2004/0034841 | A1 | 2/2004 | Reblewski |
| 2004/0078187 | A1* | 4/2004 | Reblewski ................... 703/28 |

FOREIGN PATENT DOCUMENTS

| | | |
|---|---|---|
| WO | WO 94/06210 | 3/1994 |

OTHER PUBLICATIONS

Miyake et al., "A gesture controlled human interface using an artificial retina chip", IEEE 1996.*

Osterman et al., "Superconducting infrared detector arrays with infrared processing circuitry", IEEE 1991.*

Agusleo et al., "Employing logic-enhanced memory for high performance ATM network interfaces", IEEE 1996.*

Vries et al., "Built-in self-test methodology for A/D converters", IEEE 1997.*

Azais et al., "A low-cost adaptive ramp generator for analog BIST applications", IEEE, May 2001.*

Kim et al., "A reconfigurable multi-function computing cache architecture", ACM 2000.*

Erhard et al.,. W. First Steps-Towards a Reconfigurable Asynchronous System, IEEE International Workshop on Rapid System Prototyping, 1999, pp. 28-31.

Kocan et al., F. Concurrent D-Algorithm on Reconfigurable Hardware, IEEE/ACM International Conference on Computer-Aided Design, 1999, Digest of Technical Papers, pp. 152-155.

Clos, Charles, "A study of Non-Blocking Switching Networks," The Bell System Technical Journal, Mar. 1953, pp. 406-424.

Bosi et al., B. Reconfigurable Pipelined 2-D Convolvers for Fast Digital Signal Processing, IEEE Transactions on Very Large Scale Integration (VLSI) Systems, vol. 7, Issue 3, Sep. 1999, pp. 299-308.

Ejnioui et al., A. Design Partitioning on Single-Chip Emulation Systems, 13th International Conference on VLSI Design, 2000, pp. 234-239.

Jean, J.S.N., et al., "Dynamic Reconfiguration to Support Concurrent Applications," IEEE Transactions on Computers, Jun. 1999, IEEE, USA, vol. 48, No. 6, pp. 591-602.

Snider, G., "The Teramac Compiler," Nov. 29, 1993, pp. 1-51.

Babb, J, et al., "Logic Emulation with Virtual Wires," IEEE Transactions on Computer-Aided Design of Integrated Circuits and Systems, Jun. 1997, pp. 1-20.

XILINX, "The Programmable Gate Array Design Handbook," First Edition, 1986, pp. i-A-10.

* cited by examiner

RLR = Reconfigurable Logic Resources
RIN = Reconfigurable Interconnect Network
MEM = Memory
DBR = Debugging Resources
CTX = Context (State) Elements
CR = Configuration Registers.

On-Board Data Processing Resources - 102

RLR = Reconfigurable Logic Resources
RIN = Reconfigurable Interconnect Network
MEM = Memory
DBR = Debugging Resources
CTX = Context (State) Elements
Config = Configuration registers.

EMULATION COMPONENTS AND SYSTEM INCLUDING DISTRIBUTED EVENT MONITORING, AND TESTING OF AN IC DESIGN UNDER EMULATION

BACKGROUND OF THE INVENTION

1. Field of the Invention

The present invention relates to the field of emulation. More specifically, the present invention relates to the components, such as integrated circuits and logic boards, employed to form emulation systems, and testing methodologies practiced thereon.

2. Background Information

The first generation of prior art emulation systems were typically formed using general purpose FPGAs without integrated debugging facilities. To emulate a circuit design on one of such emulation systems, the circuit design would be "realized" by compiling a formal description of the circuit design, partitioning the circuit design into subsets, mapping the various subsets to the logic elements (LEs) of the FPGAs of various logic boards of the emulation system, and then configuring and interconnecting the LEs. The partitioning and mapping operations would be typically performed on workstations that are part of or complementary to the emulation systems, while the configuration information would be correspondingly downloaded onto the logic boards hosting the FPGAs, and then onto the FPGAs.

During emulation, test stimuli are either generated on the workstation or on a service board of the emulation system under the control of the workstation, and then transferred to the various logic boards for input into the emulation ICs for application to the various netlists of the IC design being emulated. State data of various circuit elements as well as signal states of interest of the IC design being emulated, would be correspondingly read out of the applicable FPGAs, and then transferred off the logic boards, for analysis on the workstation.

With advances in integrated circuit and emulation technology, some late model emulation systems would employ "FPGAs" specifically designed for emulation purpose. These special "FPGAs" or emulation ICs typically would include substantial amount of on-chip reconfigurable logic elements, inteconnects, memory as well as debugging resources. As the advances continue, more and more of these resources are packed into each emulation IC. As a result, more and more control signals have to be transferred onto each logic board (for transfer into the emulation ICs) to configure the emulation ICs of the logic board. Likewise, more and more state elements and/or signals of interest of the emulation ICs have to be transferred out of the emulation ICs and logic boards to facilitate analysis, leading to the formation of various bottlenecks, in particular, at the logic boards, preventing efficient operation of the emulation systems.

Thus, an improved approach to forming and operating emulation systems is desired.

SUMMARY OF THE INVENTION

Data processing resources are distributively provided to an emulation system to locally and correspondingly generate testing stimuli, and applying the generated testing stimuli to partitions of an IC design to be emulated. In one embodiment, the distributed data processing resources further locally and correspondingly retrieve state data of emulation state circuit elements, analyze the retrieved state data for one or more events, and report the one or more events upon their detection.

In one embodiment, the distributed data processing resources are disposed on logic boards of an emulation system. In other embodiments, at least some of the distributed data processing resources are disposed on the emulation ICs of the logic boards. The board and IC disposed distributed processing resources cooperatively perform the earlier mentioned distributed and corresponding monitoring and reporting of events, and generation and application of testing stimuli.

The present invention also includes the consitution of an emulation system using the aforementioned emulation ICs and logic boards, as well as a workstation equipped to provide the event monitoring and reporting, and testing stimuli generation and application requests.

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION OF THE INVENTION

In the following description, for purposes of explanation, specific numbers, materials and configurations are set forth in order to provide a thorough understanding of the present invention. However, it will be apparent to one skilled in the art that the present invention may be practiced without the specific details. In other instances, well known features are omitted or simplified in order not to obscure the present invention.

Figure 1:
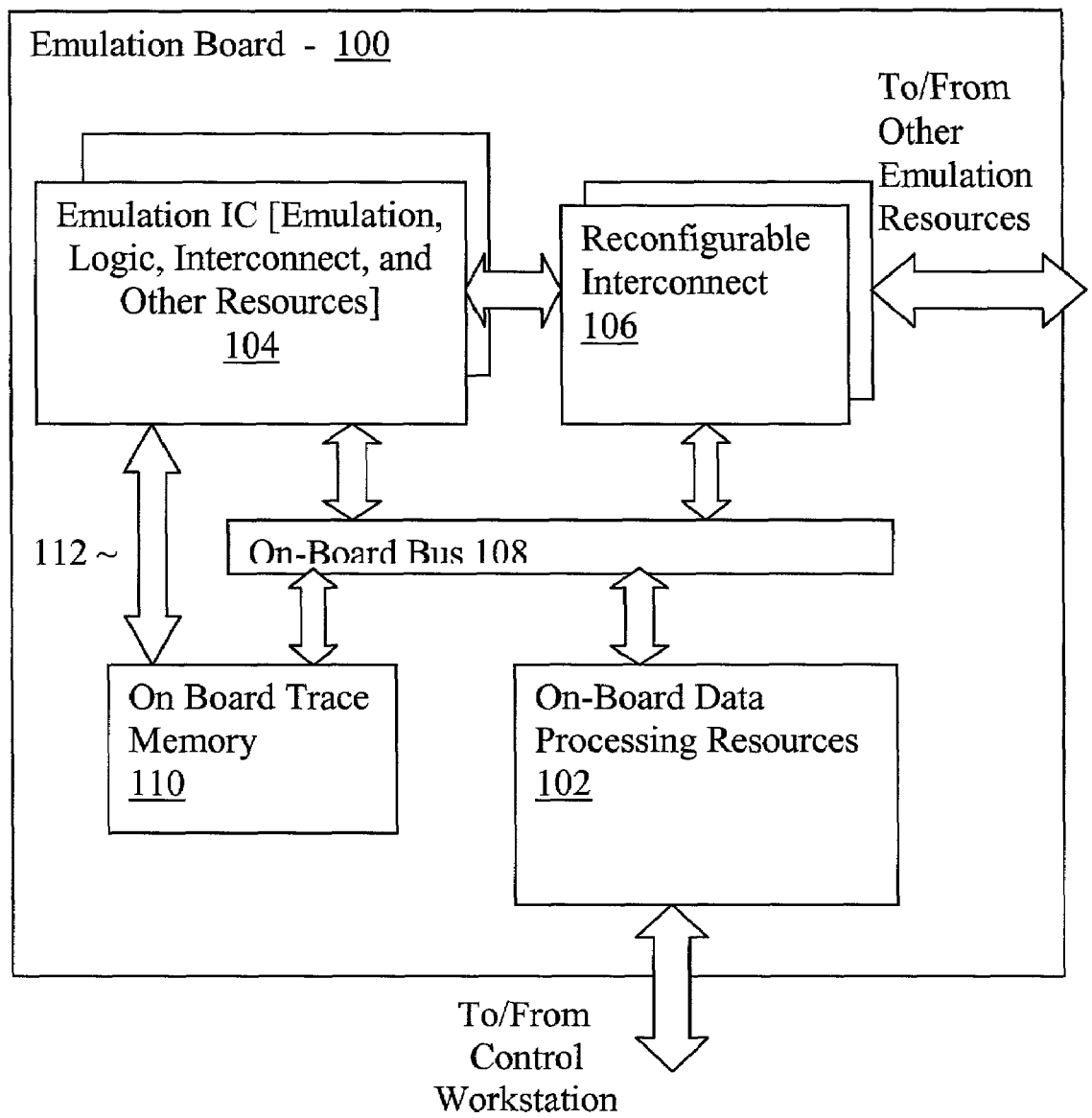
FIG. 1 illustrates the major functional blocks of a logic board incorporated with the teachings of the present invention, in accordance with one embodiment.

Referring now to FIG. 1, where an overview of a logic board incorporated with the teachings of the present invention, in accordance with one embodiment, is illustrated. As shown, for the illustrated embodiment, logic board 100 of the present invention includes on-board data processing resources 102, on-board emulation ICs 104, on-board reconfigurable interconnects 106, on-board bus 108, and on-board trace memory 110 coupled to each other as shown (i.e. through on-board bus 108). Additionally, on-board emulation ICs 104 are also directly coupled to on-board trace memory 110. Logic board 100 further includes a number of I/O pins (not explicitly illustrated). A first subset of which may be employed to couple selected ones of the outputs of reconfigurable interconnects 106 to reconfigurable interconnects of other logic boards (thereby coupling the emulation resources of the logic boards). A second subset of which may be employed to couple data processing resources 102 to certain control resources, such as a control workstation. Accordingly, a novel emulation system may be formed using multiple ones of logic board 100 and control resources, wherein data processing resources 102 of the various logic boards 100 may be employed to locally and correspondingly (i.e. distributively) perform a number of emulation functions on behalf of and at the direction of the control resources. As a result, the operation efficiency of the novel emulation system is improved.

Emulation ICs 104, in particular, their on-chip reconfigurable logic and interconnect resources, as in prior art "FPGAs", are used to "realize" the netlists of an IC design to be emulated. In various embodiments, each emulation IC 104 may advantageously include integrated debugging facilities, such as those included with enhanced "FPGAs" described in U.S. Pat. No. 5,777,489, and co-pending U.S. patent application Ser. No. 09/404,925, now U.S. Pat. No. 6,265,894, to be described more fully below.

Reconfigurable interconnects 106, as alluded to earlier, facilitate coupling of the emulation resources of the various emulation ICs 104 of the different logic boards 100 employed to form an emulation system. On-board bus 108 and trace memory 110 perform their conventional functions of facilitating on-board communication/data transfers, and collection of signal states of the various emulation signals of the assigned partition of the IC design being emulated.

In various embodiments, the emulation functions distributively and correspondingly performed on behalf of, and under the direction of the control resources, by on-board data processing resources 102 (of each logic board 100) include local determination (at the individual board level) of the routing to interconnect the reconfigurable logic resources of the hosted emulation ICs 104 to be used to emulate the circuit elements of the netlists of the partition of an IC design "assigned" to logic board 100 (i.e. distributive routing of an IC design), as well as local generation (at the board level) of configuration signals to configure the emulation resources of the on-board emulation ICs 104 and other on-board emulation resources, such as reconfigurable interconnects 106 (i.e. distributive configuration of emulation resources). Data processing resources 102 distributively and correspondingly perform these emulation functions responsive to routing and configuration requests from the control resources of the emulation system.

In various embodiments, the emulation functions distributively and correspondingly performed on behalf of, and under the direction of the control resources, by on-board data processing resources 102 (of each logic board 100) include local generation (at the board level) of testing stimuli, and application of the generated testing stimuli to the appropriate "input pins" of the IC design being emulated. In various embodiments, the emulation functions distributively and correspondingly performed on behalf of, and under the direction of the control resources, by on-board data processing resources 102 (of each logic board 100) include local determination (at the board level) of the emulation state elements of an IC design being emulated to be monitored, reading of the state data of the emulation state elements to detect occurrence of certain events, and reporting of the occurrence of the events upon their detection. Data processing resources 102 distributively and correspondingly perform these emulation functions responsive to testing and/or monitor requests from the control resources of the emulation system.

In various embodiments, the emulation functions distributively and correspondingly performed on behalf of, and under the direction of the control resources, by on-board data processing resources 102 (of each logic board 100) include local pre-processing (at the board level) of captured trace data to determine the signal state of one or more signals of interest of the IC design being emulated. Data processing resources 102 distributively and correspondingly perform these emulation functions responsive to trace data requests from the control resources of the emulation system.

The novel manners in which these emulation functions are performed provide at least the advantage of reducing the amount of control signals and data needed to be transferred in and out of emulation logic board 100 to configure emulation resources of emulation ICs 104 to emulate and debug an assigned partition of an IC design. Additionally, the present invention also provides the advantage of speeding up debugging, testing, including co-simulation of a hardware-software design, performed using an emulation system constituted with multiple ones of logic boards 100.

On-board bus 108, reconfigurable interconnects 106, system bus 108 and trace memory 110, are intended to represent a broad range of these elements known in the art, accordingly will not be further described. At least one embodiment each for emulation ICs 104 and data processing resources 102 are described in turn below.

Figure 2A:
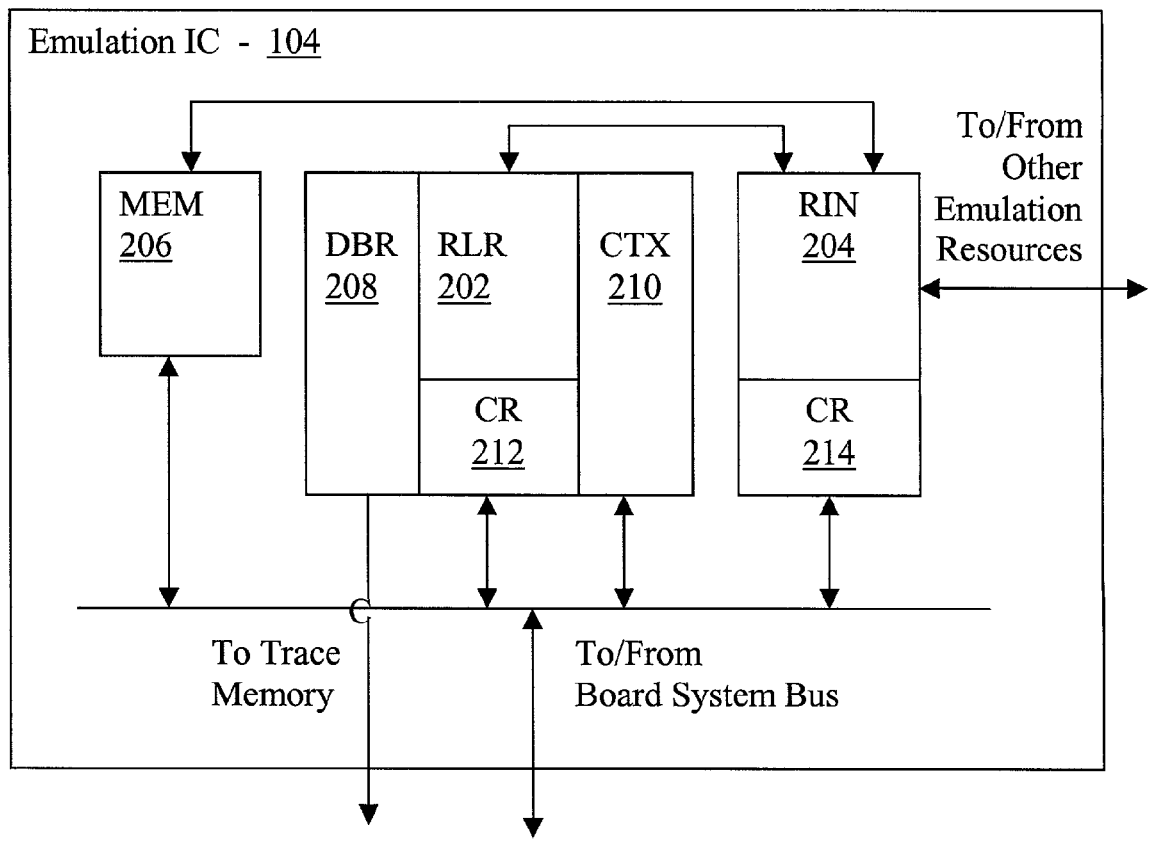
FIGS. 2a–2b illustrate a hosted emulation IC of FIG. 1 in further details, including the on-chip debugging resources of the emulation IC in further details, in accordance with one embodiment.
Figure 2B:
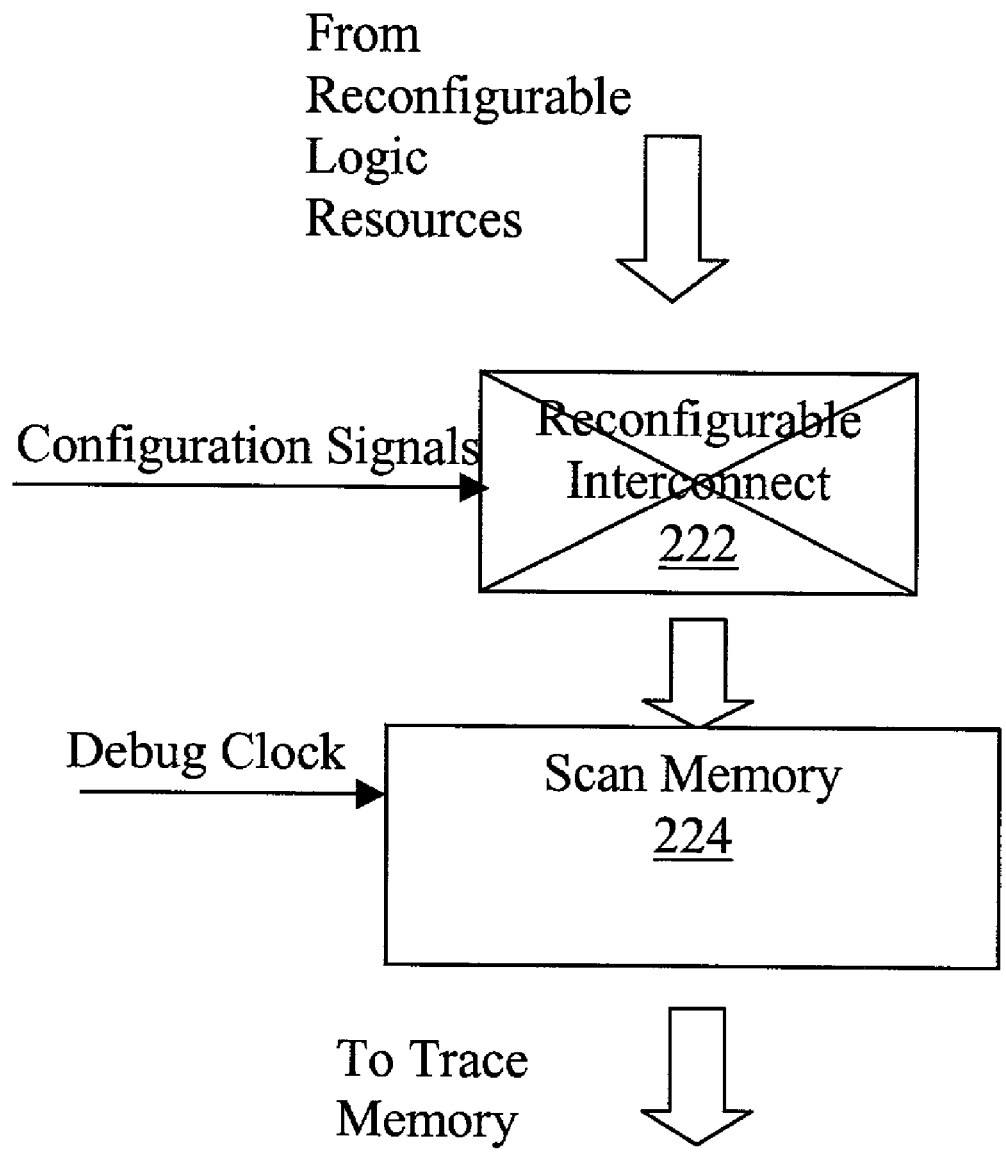

Referring now to FIGS. 2a–2b, wherein two block diagrams illustrating an emulation IC 104 in further details, in accordance with one embodiment, are shown. As illustrated in FIG. 2a, emulation IC 104 includes reconfigurable LEs (RLR) 202, reconfigurable interconnects (RIN) 204, emulation memory (MEM) 206, debugging resources (DBR) 208, context or state elements (CTX) 210, and configuration registers (CR) 212 and 214 coupled to each other as shown. Reconfigurable LEs 202, emulation memory 206 and context/state elements 210 are used to "realize" circuit elements of the netlists of an assigned partition of an IC design to be emulated. In particular, reconfigurable LEs 202 are used to "realize" the combinatorial logic of the netlists of the assigned partition of an IC design to be emulated. Context/state elements 210 are used to "realize" state elements of the netlist of the assigned partition of the IC design to be emulated, such as flip-flops, and so forth, whereas emulation memory 206 are used to "realize" storage elements of the netlists of the assigned partition of the IC design to be emulated. Reconfigurable interconnects 204 are used to reconfigurably couple LEs 202, memory 206 and so forth.

In various embodiments, configuration of these elements, including determination of the interconnect routing, to emulate the netlists of an assigned partition of an IC design, reading of state data of state elements, including determination of which state elements to read, capturing of signal states, including recreation of "unobservable" signals, are locally (i.e. distributively) performed by data processing resources 102 of the host logic board 100, to be described more fully below.

FIG. 2b illustrates certain aspects of debugging resources 208 of emulation IC 104 in further details in accordance with one embodiment. As illustrated, debugging resources 208 of an emulation IC 104 include scan memory 224 and reconfigurable interconnect 222 reconfigurably coupling scan memory 224 to the reconfigurable logic resources 202 of emulation IC 104. Scan memory 224 outputs to on-board trace memory 110.

Scan memory 224 is designed to operate responsive to a debug clock that is typically faster than the emulation clock. Accordingly, during one emulation clock cycle, scan memory 224 may enable signal states of different signals of the netlists of an assigned partition of an IC design being emulated to be captured.

Except for the novel manner on-board data processing resources 102 control and operate these enumerated elements of emulation IC 104, the various enumerated elements of emulation IC 104 are otherwise known in the art, accordingly will not be further described.

Figure 3:
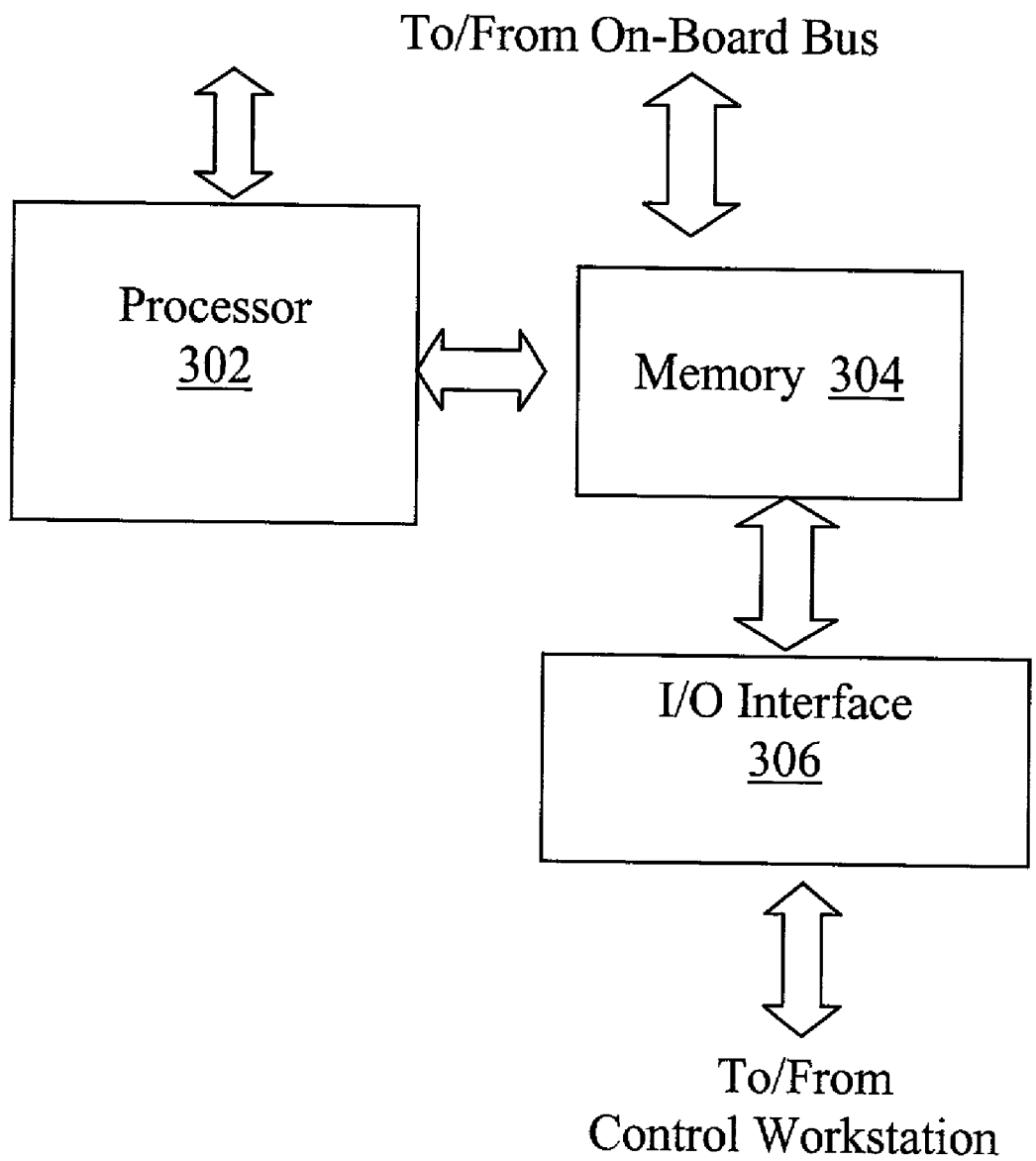
FIG. 3 illustrates the on-board data processing resources of FIG. 1 in further details, in accordance with one embodiment.

Referring now to FIG. 3, wherein a block diagram illustrating on-board data processing resources 102 of one logic board 100 in further details, in accordance with one embodiment, is shown. As illustrated, data processing resources 102, for the embodiment, include processor 302, dynamic random memory 304, and I/O interface 306, coupled to each other as shown. Processor 302, memory 304 and I/O interface 306 are also coupled to the earlier described logic board bus 108.

Memory 304 is used to store a "working" copy of the various software for performing the local (i.e. distributive) routing determination, configuration signals generation, event detection, test stimuli generation, as well as pre-processing of captured signal states, and so forth. For the illustrated embodiment, the software is downloaded to memory 304 during initialization. For this embodiment, the download is preferably staged with the software associated with interconnect routing determination and configuration signal generation being downloaded first, while the software associated with distributed debugging and testing operations download later. In alternate embodiment, logic board 100 may additionally be provided with non-volatile storage, such that a "permanent" copy of a subset or all of the requisite software may be stored. Processor 302 is used to execute the software and effectuate performance of the aforementioned functions, whereas I/O interface 306 facilitates communication between processor 302 and other entities external to logic board 100. Except for the novel use of these elements to effectuate provision of the desired advantages, these elements of data processing resources 102 are otherwise known in the art, accordingly will not be further described.

Figure 4:
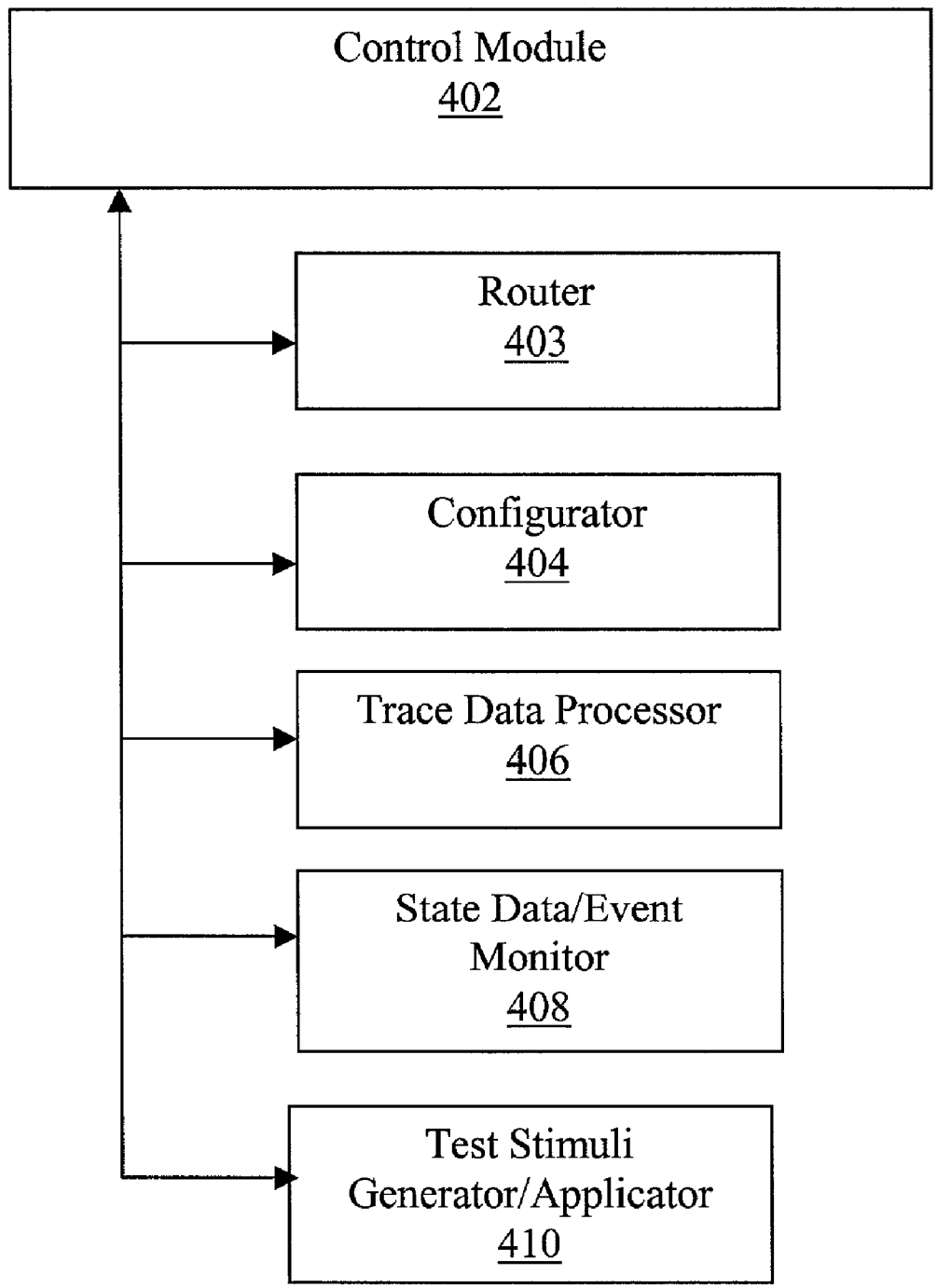
FIG. 4 illustrates an overview of the software modules provided to the data processing resources of FIG. 3 in further details, in accordance with one embodiment.

FIG. 4 illustrates an overview of the software modules provided to data processing resources 102 to provide the desire functionalities of the present invention to a logic board, in accordance with one embodiment. As illustrated, software 400 includes control module 402, and functional modules, router 403, configurator 404, trace data processor 406, state data/event detector 408, and test stimuli generator 410. Control module 402 is equipped with control logic to facilitate the overall operation in the delivery of the desired functions, including in particular communication with external entities outside a logic board 100, and invocation of appropriate ones of the functional modules. In one embodiment, control module 402 communicates with the external entities on a request and response transaction basis, via communication packets. That is, under the present invention, the assigned netlists, as well as the routing, configuration, signal state, state data of state elements, and testing requests are made, acknowledged and responded to using transaction messages sent and received in a series of communication packets. Of course, in alternate embodiments, other communication techniques may be used instead.

Figure 5:
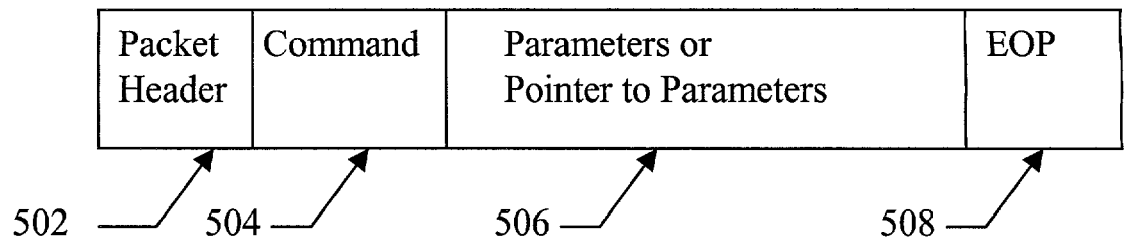
FIG. 5 illustrates an example packet suitable for use to communicate with the data processing resources of FIG. 1, in accordance with one embodiment.

FIG. 5 illustrates an example communication packet, in accordance with one embodiment, is shown. As illustrated, communication packet 500 includes packet header 502, command field 504, parameters associated with the specified commands, or pointers to these parameters 506, and end of packet marking 508. Packet header 502 and EOP 508 facilitate provision of various communication related control information, as common in the art of communication. Command 504 facilitates communication between processor 302 and the external entities on the tasks to be performed, and their results. Parameters or pointers thereto 506 augment the commands or return of results, where appropriate.

Referring back to FIG. 4, router 403 is equipped with logic to locally (therefore, correspondingly and distributively) determine the routing for interconnecting the reconfigurable resources of emulation ICs 104 assigned to emulate circuit elements of the netlists of an assigned partition of an IC design to be emulated, responsive to routing requests. Except for the fact that routing of the reconfigurable resources of emulation ICs 104 of a logic board is locally performed on the "assigned" logic board, the tasks of routing, in and of themselves, are otherwise substantially the same when they are centrally performed on a control workstation of an emulation system, and known in the art.

Configurator 404 is equipped with logic to locally (therefore, correspondingly and distributively) generate the configuration bits necessary to configure the reconfigurable logic and interconnect resources of emulation ICs 104, and the applicable interconnect resources of the logic board, in accordance with the reconfigurable logic resources and board level inteconnect centrally determined and the reconfigurable interconnect within the emulation ICs 104 locally determined, responsive to configuration requests. Similarly, except for the fact that generation of the configuration bits is locally performed on the "assigned" logic board, the tasks of generating configuration bits in accordance with a resource allocation, in and of itself, is otherwise substantially the same as the tasks are centrally performed on a control workstation of an emulation system, and also known in the art.

Trace data processor 406 is equipped with logic to locally pre-process the captured signal states of the emulation signals to determine one or more signal states of one or more signals of interest of the netlists of the assigned partition of the IC design being emulated, responsive to trace data requests. Again, except for the fact that the captured signal states of the emulation signals are pre-processed locally, reconfiguration of debugging resources and processing of capture signal states, in and of themselves, are otherwise substantially the same as these tasks are centrally performed on a control workstation of an emulation system, and also known in the art.

State data/event monitor 408 is equipped with logic to monitor emulation state elements to detect one or more events. State data/event monitor 408 is further equipped to report the occurrences of the events upon detecting their occurrences. Test vector generator/applicator 410 is equipped with logic to locally (therefore, correspondingly and distributively) generate and apply testing stimuli to the netlists of the assigned partition of the IC design being emulated. Test vector generator/applicator 410 is intended to represent a broad range of testing software known in the art. Similarly, except for the fact that retrieval of state data, event detection, generation and application of test stimuli are locally performed, each of these operations, in and of itself, is substantially the same as the operation is centrally performed at the control workstation.

Figure 6:
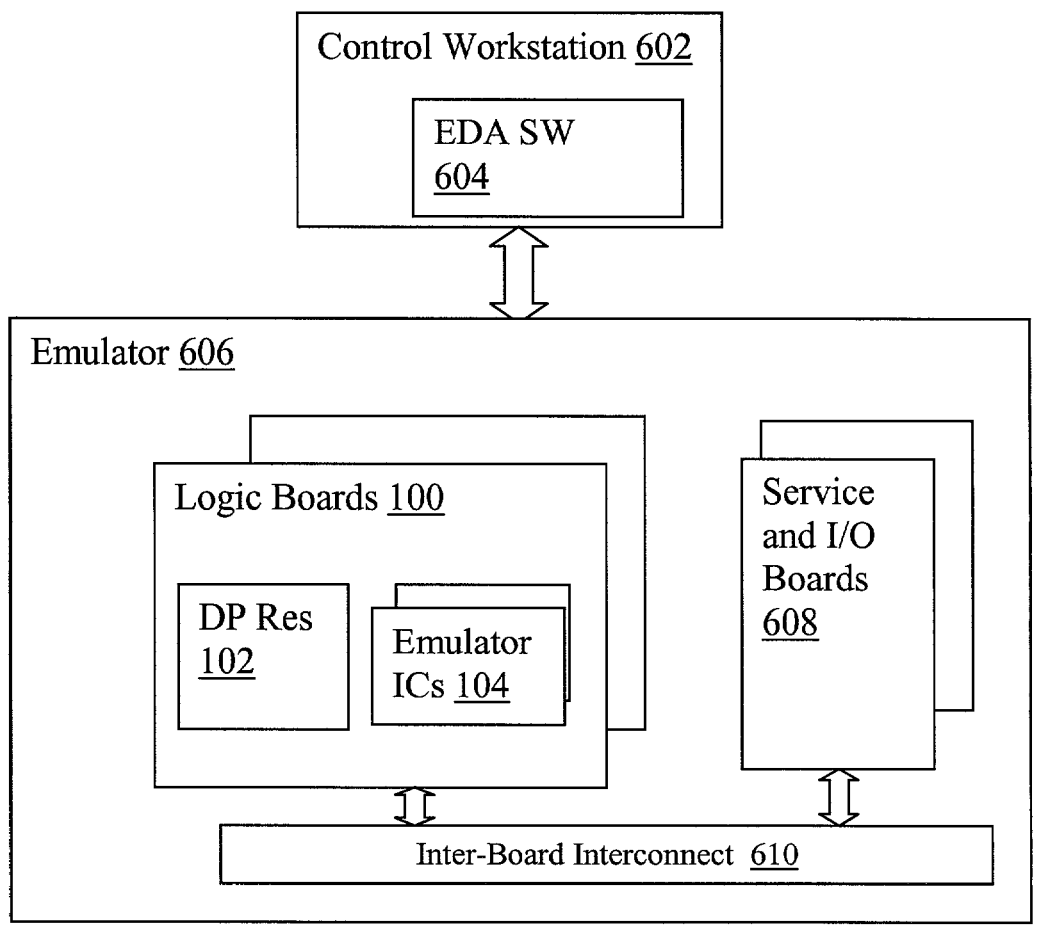
FIG. 6 illustrates an emulation system of the present invention, formed with the emulation logic board of the present invention, in accordance with one embodiment.

Referring now to FIG. 6, wherein a block diagram of an emulation system formed using logic boards 100 incorporated with the teachings of the present invention, in accordance with one embodiment, is shown. As illustrated, emulation system 600 includes control workstation 602 and emulator 606. Control workstation 602 is equipped with EDA software 604. Emulator 606 includes a number of logic boards 100, each having a number of emulation ICs 104 and on-board data processing resources 102 disposed there on as described earlier. In addition to logic boards 100, emulator 606 also includes service and I/O boards 608. Boards 100 and 608 are interconnected by inter-board interconnects 610. In one embodiment, various boards 100 and 608 are packaged together to form a crate (not shown), and the crates are interconnected together via inter-board interconnect 610. The precise numbers of emulation ICs 104 disposed on each board, as well as the precise manner in which the various boards are packaged into crates are unimportant, and application dependent.

EDA software 604 is incorporated with the teachings of the present invention, in particular, the corresponding distribution of emulation logic board level routing of the interconnects for netlists of the various partitions of an IC design to be emulated, and configuration of the emulation resources of the emulation ICs of a logic board, to the logic boards themselves. Except for the teachings of the present invention incorporated, EDA software 604 is otherwise intended to represent a broad range of the software typically supplied with an emulation system, including in particular the software for partitioning the netlists of an IC design to be emulated at the system level, and the software for debugging and testing an IC design being emulated, such as model simulators.

Similarly, except for the employment of emulation logic boards 100, thereby providing the desired advantages, emulator 606 is also intended to otherwise represent a broad range of emulators known in the art.

Figure 7:
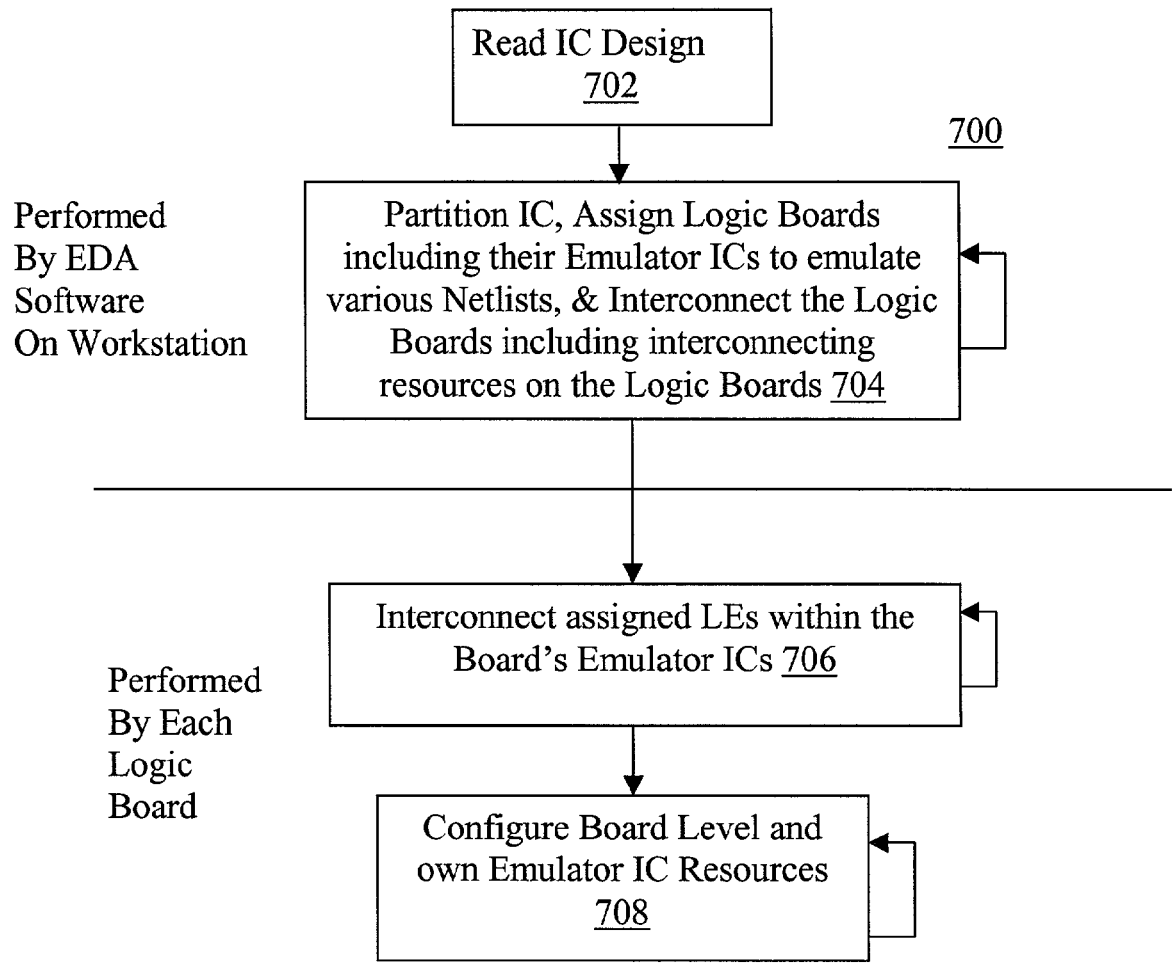
FIG. 7 illustrates the operation flow of a method of the present invention for distributively and correspondingly routing the interconnects for circuit elements of the netlists of a partition of an IC design, and configuring the reconfigurable resources of the emulation system, in accordance with one embodiment.
Figure 8:
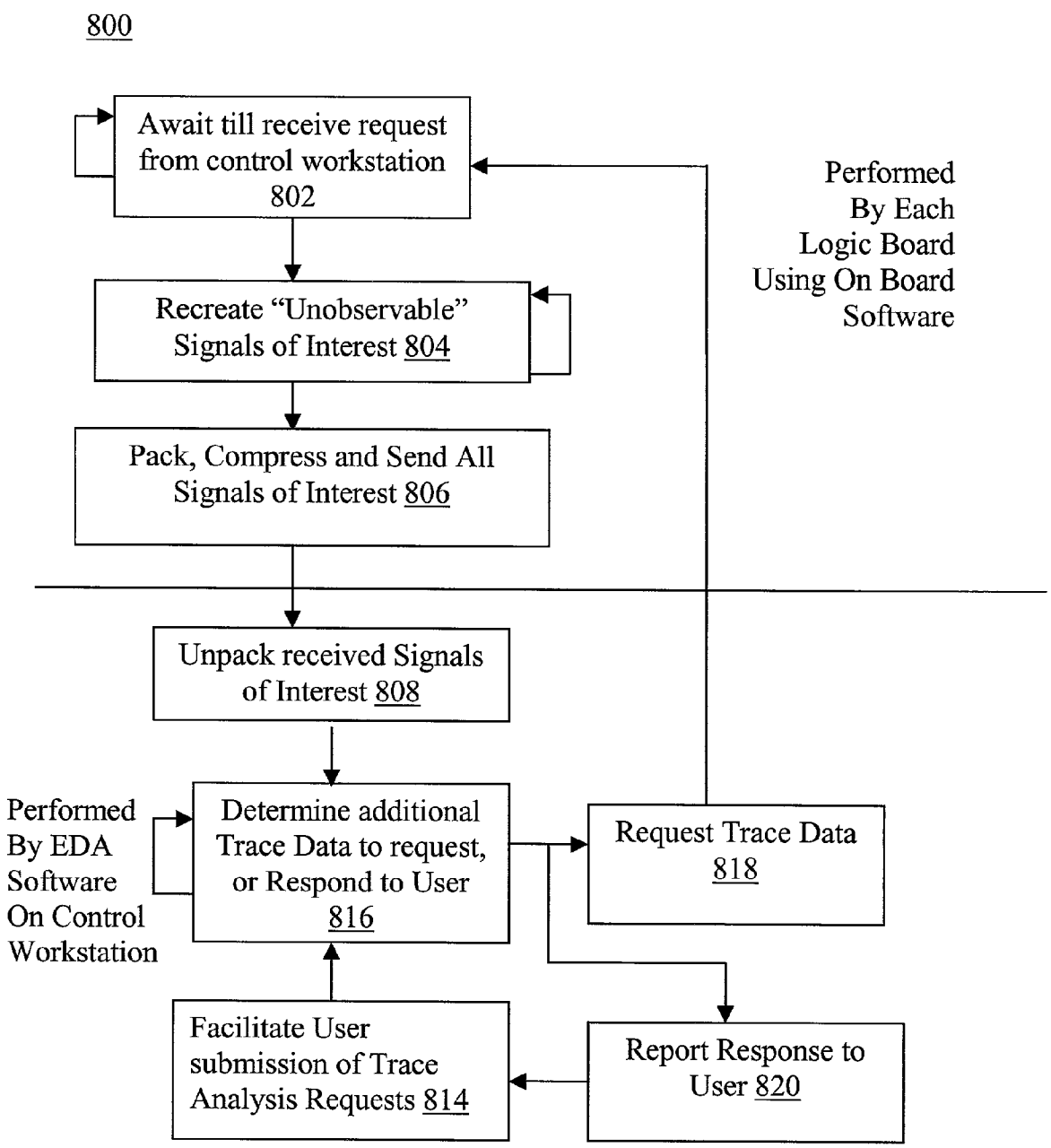
FIG. 8 illustrates the operation flow of a method of the present invention for distributively and correspondingly pre-processing trace data of interest of an IC design being emulated, in accordance with one embodiment.
Figure 9:
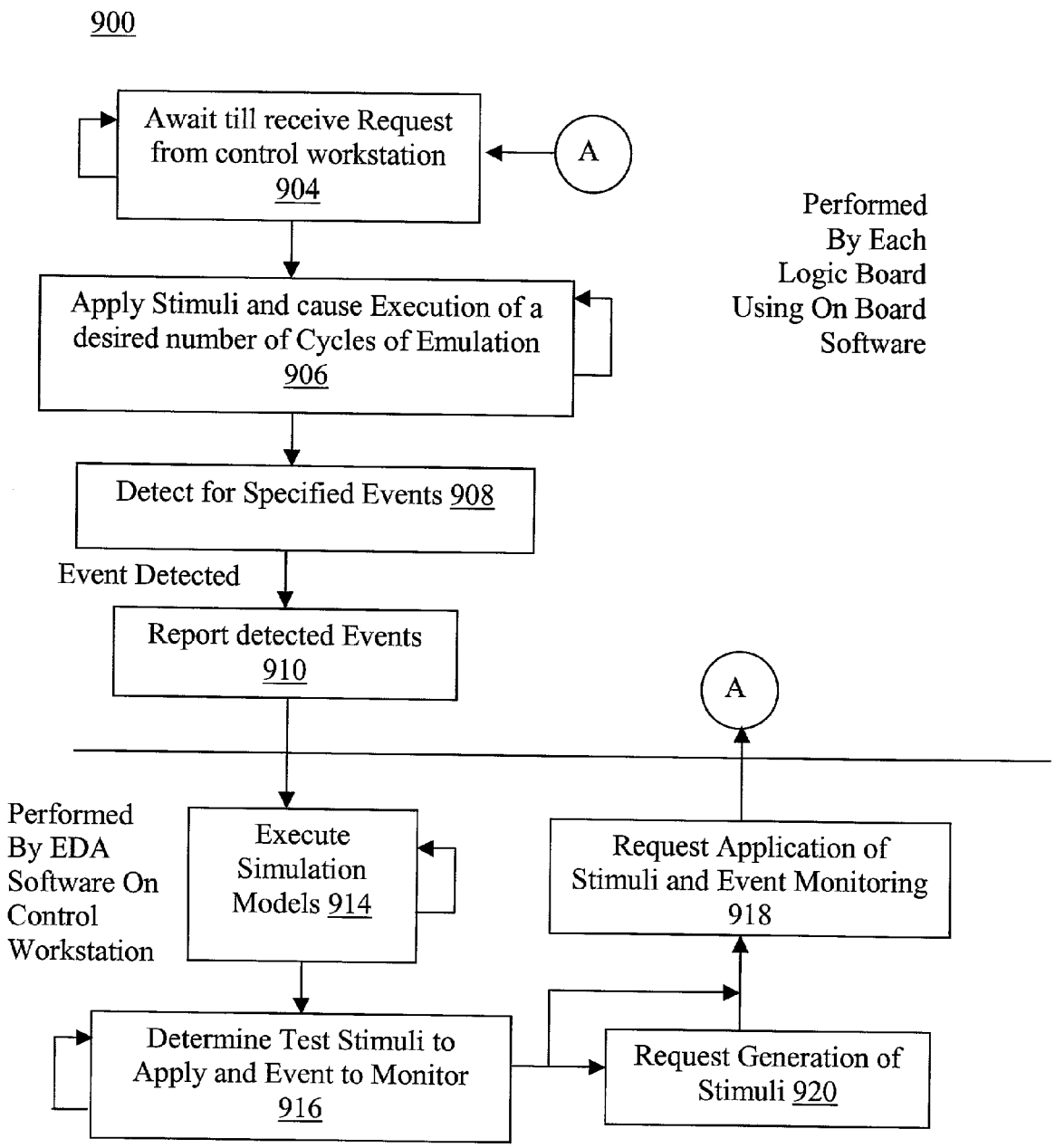
FIG. 9 illustrates the operation flow of a method of the present invention for distributively and correspondingly generating and applying testing stimuli, as well as monitoring for occurrences of selected events, in accordance with one embodiment.

Referring now to FIGS. 7–9, wherein three flow diagrams illustrating the essential flows of the methods of the present invention for locally and correspondingly performing a number of emulation functions by distributed data processing resources 102 of various logic boards 100 on behalf of and under the direction of the control resources of an emulation system, in accordance with three embodiments, are illustrated. For these embodiments, in addition to the provision of the necessary software functions, such as those illustrated referencing FIG. 4, distributed data processing resources 102 of various logic boards 100 are also provided with, either at initialization, in conjunction with the requests or combinations thereof, the netlists of their assigned partitions of the IC design to be emulated, including their state as well as combinatorial circuit elements, the mappings between the emulation circuit elements and the "original" circuit elements, and the mappings between the observable emulation signals and the "unobservable" signals, if transformations were performed on some of the circuit elements. Distributed data processing resources 102 of various logic boards 100 are also provided with the identifications of the reconfigurable logic resources of their emulation ICs 104 to be employed to emulate the various circuit elements of the netlists of the assigned partitions.

Referring now to FIG. 7, wherein the method of the present invention for locally and correspondingly determining interconnect routing (within the emulation ICs of a logic board) and generating configuration signals (for board level and within emulation IC interconnects) by distributed data processing resources 102 of various logic boards 100, in accordance with one embodiment, is shown. As illustrated, the method starts with the EDA software 604 executing on workstation 602 reading an IC design to be emulated, block 702. EDA software 604 first partitions the netlists of the IC design into partitions to be emulated by the emulation ICs 104 of the various logic boards 100, assigning the netlists of the various partitions to the various logic boards 100, block 704. For the embodiment, EDA software 604 also determines routing on the various logic boards 100 to interconnect the assigned emulation ICs 104 of the logic boards, also block 704. Further, EDA software 604 provides the various logic boards 100 with the relevant assignment and on-board routing information, block 704, as well as requests the interconnect routing within the assigned emulation ICs 104 to be determined locally by the corresponding logic boards 100. Moreover, the configuration bits for configuring the various reconfigurable logic and interconnect resources are to be generated locally by the corresponding logic boards 100. If necessary, the provision and request operations are iteratively re-performed.

Upon receipt of the provided assignment and on-board information, and the on-chip routing and configuration requests, the router/configuration software, executed by distributed data processing resources 102 of each of logic boards 100, locally and correspondingly determine the routing within emulation ICs 104 of logic boards 100 to interconnect the reconfigurable logic resources within the assigned emulation ICs 104 of the logic boards 100 allocated to emulate the circuit elements of the netlists of the partitions of the IC design, block 706. Again, if necessary, the operation is iteratively re-performed.

Further, distributed data processing resources 102 of each logic board 100 would locally and correspondingly generate the appropriate configuration bits to configure the allocated emulation resources of the hosted emulation ICs 104, and the on-board resources of logic boards 100 according to the centrally determined partition and board level routing, and locally determined within emulation IC routing, block 708. Similarly, if necessary, the operation is iteratively re-performed.

As a result, as alluded to earlier, the amount of signals having to be transferred to the various emulation logic boards 100 to configure the emulation resources of their hosted emulation ICs 104 to realize an IC design is advantageously reduced.

Referring now to FIG. 8, wherein the method of the present invention for locally and correspondingly preprocess captured trace data of interest by distributed data processing resources 102 of various logic boards 100, in accordance with one embodiment, is shown. As illustrated, EDA software 604 facilitates a user in submitting various trace analysis requests, block 814. In response to the submission of a user request, EDA software 604 determines if additional data from the distributed logic boards 100 are necessary to satisfy the user' request, block 816. If not, response is provided to the user, block 820. On the other hand if additional trace data is required, one or more requests for the trace data are provided to the applicable one or ones of distributed data processing resources 102 of logic boards 100. In one embodiment, the trace data requested may include state values of observable as well as "unobservable" signals. For "unobservable" signals, the requests include identification of the unobservable signals of interest, the relevant observable emulation signals from which the "unobservable" signals may be inferred, and the functions for use to infer the signal states of the "unobservable" signals of interest from the relevant observable emulation signals.

At block 804, distributed data processing resources 102 of the requested logic boards 100, upon receipt of the trace data requests, locally and correspondingly re-create the "unobservable" emulation signals of interest. At block 806, upon re-creating the "unobservable" signals, distributed data processing resources 102 of various logic boards 100 correspondingly pack and compress the requested observable as well as the "unobservable" signals of the logic boards 100 for return to EDA software 604.

Upon receipt of the packed and compressed observable and "unobservable" signals of interest, EDA software 604 decompresses and unpacks to recover the requested signals of interest. Thereafter, the process continues from block 816 as earlier described.

Packing and compression may be practiced using any of these techniques known in the art.

Referring now to FIG. 9, wherein the method of the present invention for locally and correspondingly generating and applying testing stimuli as well as monitoring for occurrence of certain events by distributed data processing resources 102 of various logic boards 100, in accordance with one embodiment, is shown. As illustrated, EDA software 604, more specifically, various simulation models are executed on control workstation 602, block 914. At block 916, EDA software 604 determines if certain test stimuli are to be applied and events are to be monitored, including whether test stimuli are to be generated.

If certain stimuli are to be applied and occurrences of certain events are to be monitored, EDA software 604 requests selected ones of distributed data processing resources 102 of various logic boards 100 to apply the stimuli of interest, and perform the monitoring, block 918. In one embodiment, each of the requests includes the emulation state elements from whose state data the occurrence of the events of interest may be discerned. Further, EDA software 604 determines if the stimuli needs to be generated, if so, the stimuli are generated accordingly.

Thus, upon receipt of the request, distributed data processing resources 102 of requested logic boards 100 access the relevant emulation state data, block 906. Data processing resources 102 of requested logic boards 100 analyze the retrieved state data to detect occurrences of the events of interest, block 908. Upon detecting one or more occurrences of the events of interest, distributed data processing resources 102 of the detecting logic boards 100 report the detection or detections accordingly, block 910. Thereafter, the process proceeds as earlier described.

Figure 10:
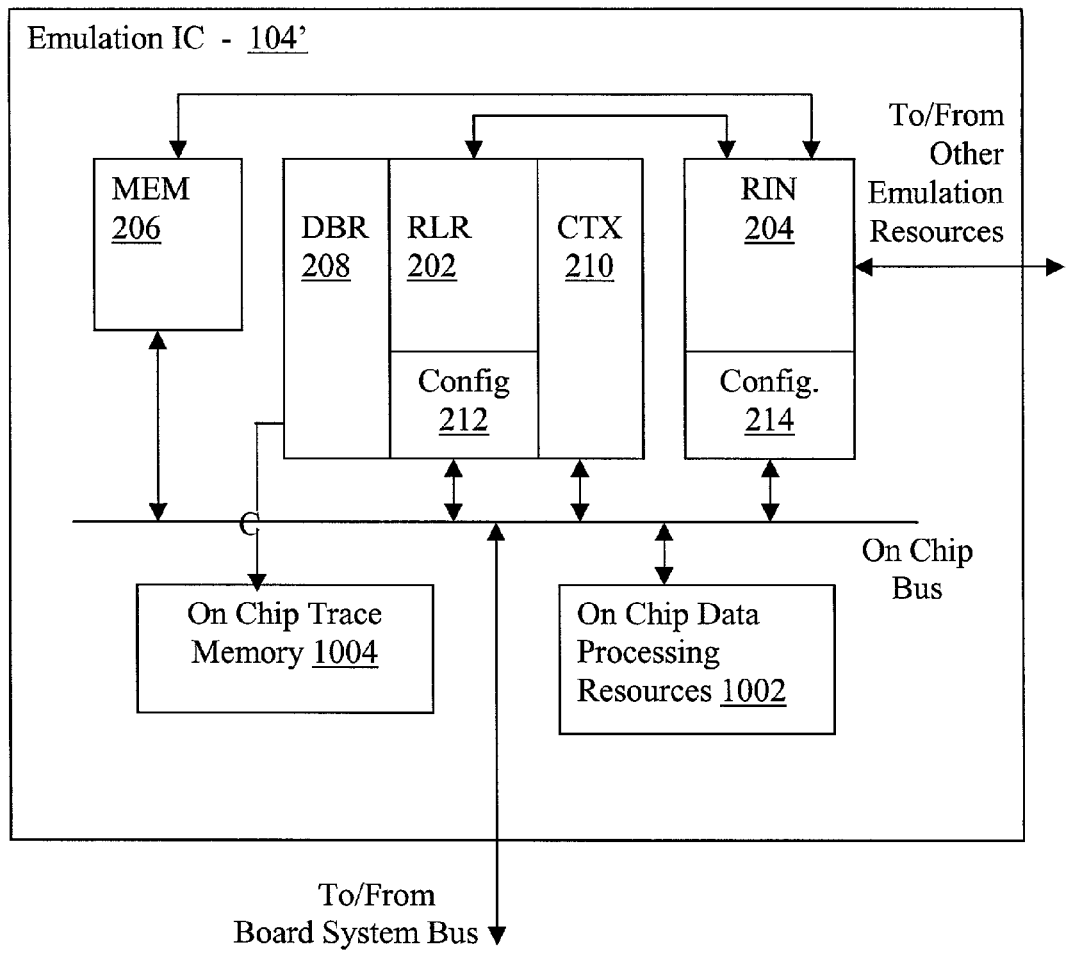
FIG. 10 illustrates a hosted emulation IC of FIG. 1 in further details, in accordance with an alternate embodiment.

Referring now to FIG. 10, wherein a block diagram illustrating an emulation IC 104', in accordance with an alternate embodiment, is shown. As illustrated, emulation IC 104' includes reconfigurable LEs (RLR) 202, reconfigurable interconnects (RIN) 204, emulation memory (MEM) 206, debugging resources (DBR) 208, context or state elements (CTX) 210, and configuration registers (CR) 212 and 214 coupled to each other as before (i.e. through on-chip bus). However, for this embodiment, emulation IC 104' additionally include data processing resources 1002 and trace memory 1004. Further, debugging resources (DBR) 208 are directly coupled to on-chip trace memory 1004.

Data processing resources 1002 is provided to supplement data processing 102 provided to logic board 100. Selected ones of the software components illustrated in FIG. 4 are provided to data processing resources 1002 where the corresponding functions are executed on emulation IC 102 in lieu of being executed on host logic board 100. Similarly, trace memory 1004 is provided to augment trace memory 110 provided to host logic board 100. In some embodiment, trace memory 1004 of various emulation ICs 104' completely replace trace memory 110 of a host logic board 100. That is, for these embodiments, trace memory 110 is no longer provided to logic board 100.

Except for their disposition on emulation IC 102, their constitutions and functions are substantially the same as their earlier described board disposed counterpart.

Thus, emulation components including emulation IC and logic boards, and an emulation system constituted with such components, including distributed and local generation and application of testing stimuli, and event monitoring and reporting have been described. While the method and integrated circuit of the present invention has been described in terms of the above illustrated embodiments, those skilled in the art will recognize that the invention is not limited to the embodiments described. The present invention can be practiced with modification and alteration within the spirit and scope of the appended claims. For example, the various novel features described may be packaged in finer or coarser units of form factors. The description is thus to be regarded as illustrative instead of restrictive on the present invention.

What is claimed is:

1. A logic board designed for circuit emulation, comprising
   a plurality of input/output (I/O) pins;
   a plurality of emulation integrated circuits (IC), each having reconfigurable logic and interconnect resources reconfigurable to emulate circuit elements of a partition of an IC design; and
   a plurality of on-board data processing resources coupled to said emulation ICs to locally retrieve from said emulation ICs state data of emulated circuit elements, responsive to a monitor and report request received through said I/O pins, and to locally analyze the retrieved state data to detect occurrence of one or more events, as well as report on the occurrence of the one or more events upon their detection through said I/O pins;
   wherein the on-board data processing resources are further employed to locally generate a plurality of testing stimuli, and locally apply said locally generated testing stimuli to emulation circuit elements of a respective emulation IC corresponding to said partition of the IC design being emulated, responsive to a testing request received through said I/O pins, and wherein at least one of said emulation ICs comprises on-chip programmable data processing resources to cooperate with and assist said onboard data processing resources to perform said local generation and application of testing stimuli.

2. The logic board as set forth in claim 1, wherein the on-board data processing resources comprise a storage medium having stored therein programming instructions designed to operate the logic board to perform said responsive local retrieval of state data of the emulated circuit elements, local analysis of the retrieved state data, and reporting of event detection, and a processor coupled to the storage medium to execute the programming instructions.

3. The logic board as set forth in claim 1, wherein at least one of said emulation ICs comprises on-chip data processing resources to cooperate and assist said on board data processing resources to perform said local monitoring and reporting of monitored events.

4. The logic board as set forth in claim 1, wherein the on-board data processing resources comprise a storage medium having stored therein programming instructions designed to operate the logic board to perform said responsive local generation and application of stimuli, and a processor coupled to the storage medium to execute the programming instructions.

5. In an emulation apparatus, a method of operation comprising:
   receiving by an emulation logic board, through input/output (I/O) pins of said logic board, a monitor and report request;
   in response, locally retrieving from emulation ICs of said logic board state data of emulated circuit elements of a partition of an IC design being emulated;
   locally analyzing said retrieved state data to detect occurrence of one or more events; and
   reporting through said I/O pins of said logic board occurrence of said one or more events, upon detection of their occurrence;
   wherein the method further comprises locally generating on said logic board a plurality of testing stimuli, and applying said locally generated testing stimuli to emulation circuit elements of a respective emulation IC corresponding to said partition of the IC design being emulated, responsive to an external testing request received by said logic board through said I/O pins of the logic board, and wherein at least some of said generation of testing stimuli are performed by on-chip programmable data processing resources of said emulation ICs.

6. The method as set forth in claim 5, wherein at least some of said analysis and detection are performed by on-chip data processing resources of said emulation ICs, in lieu of retrieving the state data from the emulation ICs and then analyzing the state data to detect for the one or more events.

7. A logic board designed for circuit emulation, comprising
   a plurality of input/output (I/O) pins;
   a plurality of emulation integrated circuits (IC), each having reconfigurable logic and interconnect resources reconfigurable to emulate circuit elements of a partition of an IC design; and
   a plurality of on-board data processing resources coupled to said emulation ICs to locally generate a plurality of testing stimuli, and locally apply said locally generated testing stimuli to emulated circuit elements of a respective emulation IC corresponding to said partition of the IC design being emulated, responsive to an external testing request received through said I/O pins;
   wherein at least one of said emulation ICs comprises on-chip programmable data processing resources to cooperate with and assist said on-board data processing resources to perform said local generation and application of testing stimuli.

8. The logic board as set forth in claim 7, wherein the on-board data processing resources comprise a storage medium having stored therein programming instructions designed to operate the logic board to perform said responsive local generation and application of stimuli, and a processor coupled to the storage medium to execute the programming instructions.

9. In an emulation apparatus, a method of operation comprising:
   receiving by a logic board, through input/output (I/O) pins of said logic board, a testing request;
   in response, locally generating on said logic board a plurality testing stimuli; and
   locally applying said locally generated testing stimuli to emulation circuit elements of an emulation IC corresponding to a partition of an IC design being emulated;
   wherein at least some of said generation of testing stimuli are performed by on-chip programmable data processing resources of said emulation ICs.

10. An emulation system comprising:
    a plurality of logic boards, each having a plurality of emulation integrated circuits (IC) including reconfigurable logic and interconnect resources reconfigurable to emulate circuit elements of a respective emulation IC corresponding to a respective one of partitions of an IC design, and on-board data processing resources to locally and correspondingly generate testing stimuli, and apply the generated stimuli to the emulated circuit elements of a respective emulation IC corresponding to a respective one of the partitions of the IC design being emulated, responsive to testing requests received through input/output (I/O) pins of the logic boards; and
    a workstation coupled to the logic board, including electronic design automation (EDA) software to provide said logic boards with said testing requests;
    wherein at least one of said emulation ICs of said logic boards comprises on-chip programmable data processing resources to cooperate with and assist the on-board data processing resources of the logic board to perform said local and corresponding generation and application of testing stimuli.

11. The emulation system as set forth in claim 10, wherein the on-board data processing resources of each of the logic board comprise storage medium having stored therein programming instructions designed to operate the logic board to perform said local and corresponding generation and application of testing stimuli.

12. In an emulation system, a method of operation comprising:
    locally and correspondingly generating testing stimuli; and
    locally and corresponding applying the generated testing stimuli to selected ones of the emulation circuit elements of emulation ICs corresponding to respective partitions of an IC design being emulated;
    wherein at least some of said performances of local and corresponding generation and application of testing stimuli are assisted by on-chip programmable data processing resources of the emulation ICs of the logic boards.

13. In an emulation integrated circuit (IC), a method of operation comprising:
    locally retrieving on said emulation IC, using on-chip data processing resources, state data of emulated circuit elements of the emulation IC corresponding to a partition of an IC design being emulated;
    locally analyzing said state data of the emulated state circuit elements, using on chip data processing resources, to detect occurrence of one or more events; and
    reporting on occurrence of said one or more events upon detecting their occurrence;
    wherein the method further comprises locally generating testing stimuli using said on-chip programmable data processing resources; and locally applying the generated testing stimuli to an IC design being emulated, using said on-chip data processing resources.

14. An emulation integrated circuit (IC) comprising:

a plurality of reconfigurable logic and interconnect resources configured to form emulated circuit elements corresponding to a partition of an IC design being emulated; and programmable on-chip data processing resources coupled to said reconfigurable logic and interconnect resources to locally generate testing stimuli, and locally apply the generated testing stimuli to at least one of said emulated circuit elements.

15. The emulation IC as set forth in claim 14, wherein said on-chip data processing resources comprise a storage medium having stored therein programming instructions designed to perform said local generation and application of testing stimuli.

16. In an emulation integrated circuit (IC) comprising a plurality of reconfigurable logic and interconnect resources configured to form emulated circuit elements corresponding to a partition of an IC design being emulated, a method of operation comprising:

locally generating on said emulation IC testing stimuli, using programmable on-chip data processing resources; and locally applying the testing stimuli, using said programmable on-chip data processing resources, to at least one of said emulated circuit elements.

* * * * *